United States Patent [19]

Wieser et al.

[11] Patent Number: 4,484,148
[45] Date of Patent: Nov. 20, 1984

[54] CURRENT SOURCE FREQUENCY COMPENSATION FOR A CMOS AMPLIFIER

[75] Inventors: James B. Wieser, Sunnyvale; Ray A. Reed, San Jose, both of Calif.

[73] Assignee: National Semiconductor Corporation, Santa Clara, Calif.

[21] Appl. No.: 417,769

[22] Filed: Sep. 13, 1982

[51] Int. Cl.³ .............................................. H03F 3/45
[52] U.S. Cl. ..................................... 330/253; 330/85; 330/260; 330/294; 330/311
[58] Field of Search ................. 330/85, 253, 260, 294, 330/307, 311, 107

[56] References Cited

U.S. PATENT DOCUMENTS 4,315,223  2/1982  Haque .................................. 330/253

OTHER PUBLICATIONS

Aghion et al., "Use of Positive Feedback to Enhance the Open–Loop Gain of Fast Operational Amplifiers", Alta Frequenza, vol. XLVII, No. 11, Nov. 1978, pp. 485E–815, 816–486E, 487E–817, 818–488E.

Primary Examiner—James B. Mullins
Attorney, Agent, or Firm—Gail W. Woodward; Paul J. Winters; Michael J. Pollock

[57] ABSTRACT

A CMOS linear amplifier is disclosed with a frequency compensation circuit that employs a Miller integrater construction in which the feedback capacitor is coupled by way of a noninverting amplifier operating at constant current and therefore does not load the inverting amplifier input or bypass the integrator amplifier.

7 Claims, 3 Drawing Figures

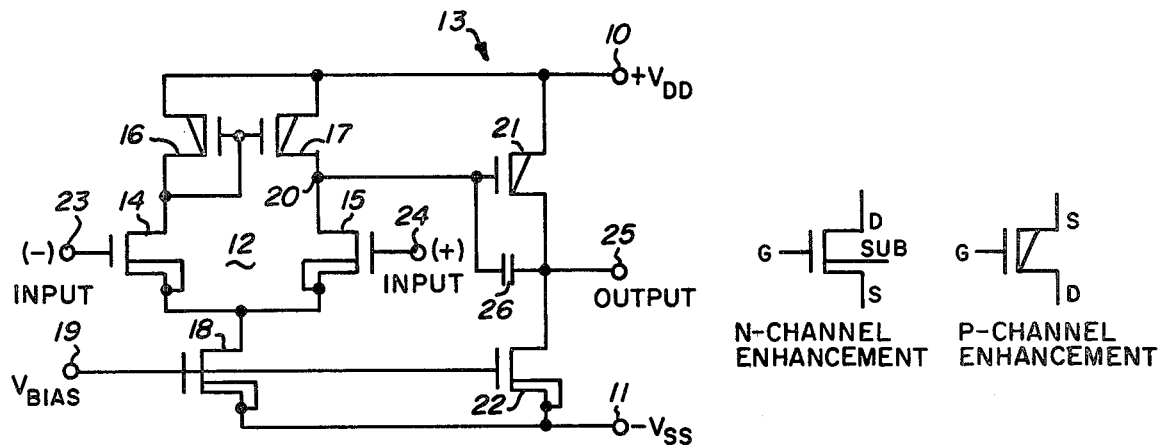
*Fig_1* (PRIOR ART)
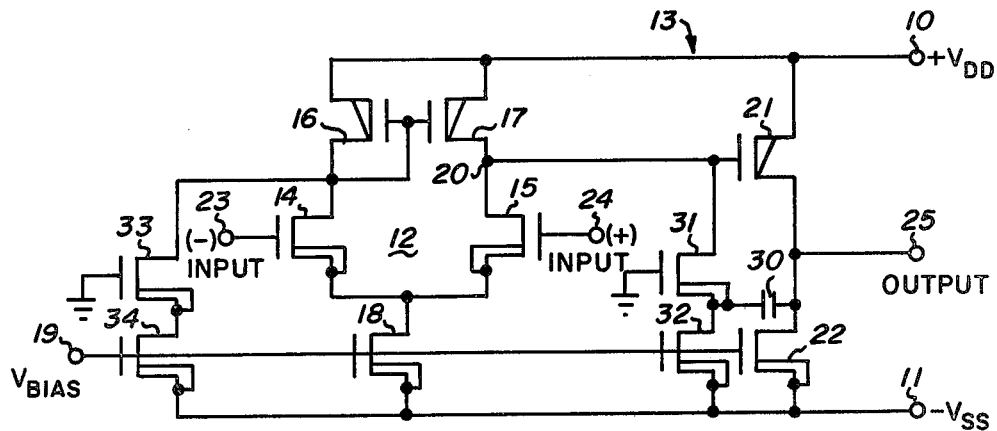
*Fig_2*
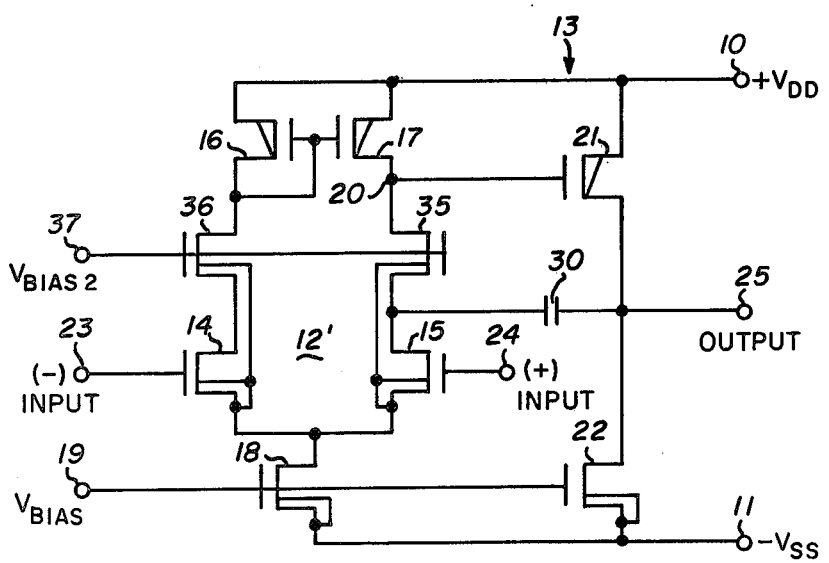
*Fig_3*

CURRENT SOURCE FREQUENCY COMPENSATION FOR A CMOS AMPLIFIER

BACKGROUND OF THE INVENTION

Complementary metal oxide semiconductor (CMOS) integrated circuit (IC) construction has become very popular for use in linear signal amplifier applications. Such amplifiers can be incorporated into IC chips which also contain conventional CMOS digital circuits commonly in the Form of large scale integrated circuit (LSIC) structures. While many CMOS amplifier circuit configurations have been developed along the lines of bipolar circuits, the actual implementations often produce problems. In general, while the bipolar device circuits have been developed over many years and, as evolved, work very well, a CMOS equivalent may operate somewhat differently and a direct equivalent may not perform in a completely satisfactory manner.

In particular, bipolar amplifier design frequency compensation has been developed to a relatively fine art and very satisfactory circuits are in use. However, if a similar frequency compensation scheme is transformed to a CMOS circuit, the resultant performance is often not fully equivalent and the overall performance may not be acceptable.

Reference is made to a copending patent application Ser. No. 364,548 filed Apr. 1, 1982, by James B. Wieser. This application is titled CMOS VOLTAGE REFERENCE and is incorporated herein by reference. It shows a CMOS circuit which develops a temperature stable voltage and includes a frequency compensated linear high gain amplifier.

SUMMARY OF THE INVENTION

It is an object of the invention to provide a CMOS linear amplifier having an improved frequency compensation circuit that ensures unity gain stability and provides better power supply rejection than previous designs.

It is a further object of the invention to implement an improved frequency compensation circuit in a CMOS linear amplifier, using as few parts as possible, for applications of analog amplifiers to LSIC construction.

These and other objects are achieved as follows. A linear amplifier is made up of a differential input stage that drives a high gain inverting amplifier stage. Frequency compensation is achieved by means of a capacitor coupled around the inverting amplifier stage to create a Miller integrator action. The invention involves coupling a voltage controlled current source in series with the capacitor feedback path. The current source is preferably implemented as a common gate transisitor amplifier in the feedback loop and can take the form of either a separate feedback amplifier or a cascode load in the differential input stage.

BRIEF DESCRIPTION OF THE DRAWING

FIG. 1 is a schematic diagram of a prior art form of a CMOS amplifier using conventional frequency compensation.

FIG. 2 is a schematic diagram of a CMOS amplifier circuit employing the invention.

FIG. 3 is an alternative embodiment of the invention.

DESCRIPTION OF THE PRIOR ART

With reference to FIG. 1 a CMOS amplifier is shown. A power supply is connected between $+V_{DD}$ terminal 10 and $-V_{SS}$ terminal 11. Two stages are shown. Input stage 12 is composed of a differential transistor pair of N-channel devices 14 and 15, current mirror load P-channel transistors 16 and 17, and an N-channel tail current sink 18. Transistor 18 is conventionally biased on by a $V_{BIAS}$ potential applied to terminal 19 which is normally biased slightly over one N-channel transistor threshold above $-V_{SS}$.

The input stage provides a single ended output at node 20 which is directly coupled to inverting amplifier stage 13. This stage is composed of a P-channel driver 21 and an N-channel current sink load 22 which together form the inverting amplifier. Current sink 22 is biased in parallel with tail current sink 18. Using the configuration shown, output terminal 25 will respond at high gain to differential input signals applied across inverting input terminal 23 and noninverting input terminal 24.

A frequency compensation capacitor 26 is shown coupled between node 20 and output terminal 25. This capacitor is in effect a negative feedback element around inverting amplifier stage 13. This creates a Miller integrator in which an effective capacitor loads node 10 and which is equal to one plus the gain of stage 13 times the value of capacitor 26. Such a configuration produces a high frequency gain roll off of 6 db per octave in the conventional manner. However, several problems are associated with such a circuit.

At dc the circuit of FIG. 1 is insensitive to power supply variations because the gate of transistor 21 will track its source which is returned directly to $+V_{DD}$. Thus variations in $V_{DD}$ are rejected. In other words, by virtue of transistors 16 and 17 node 20 will track $V_{DD}$. However, with capacitor 26 present as shown, its impedance at the higher signal frequencies will become low enough that it will act to bypass node 20 so that it will no longer track $V_{DD}$. This produces a change in gate to source voltage on 21 which is amplified by stage 13 and results in poor power supply rejection at higher signal frequencies.

A second problem exists because capacitor 26 will also act as a feed forward element at the higher signal frequencies and will couple node 20 directly to output terminal 25. Since this feed forward path is not inverted by stage 13 a rising gain with increasing phase shift is produced which can cause instability at signal frequencies within the amplifer's unity gain bandwidth.

In the prior art the second problem has been recognized. One approach has been to introduce a resistance in series with capacitor 26. Typically this is done by inserting a series CMOS transmission gate biased to be conductive and having a resistance selected to produce the desired result. This has only been partially effective. Another approach as is shown in the above-referenced copending application Ser. No. 364,548 filed Apr. 1, 1982, is to employ a separate noninverting buffer amplifier stage to drive the compensation capacitor, along with a noninverting buffer amplifier stage that drives the output terminal. This involves the addition of a number of components to the circuit and increased power consumption.

DESCRIPTION OF THE INVENTION

FIG. 2 is a schematic diagram of a circuit that uses the invention. Where the various circuit elements are the same as those of FIG. 1 like reference numerals are employed. Input stage 12 and output stage 13 operate in the same manner as for FIG. 1. However, compensation capacitor 30 is connected differently.

A voltage controlled current source in the form of N-channel transistor 31 is coupled in series with capacitor 30 and node 20. Transistor 31 acts as a common gate amplifier device with N-channel current sink 32 returning its source to the $-V_{SS}$ supply at terminal 11. The gate of transistor 31 is returned to ground which represents a potential (normally midway) between the levels of $+V_{DD}$ and $-V_{SS}$. Capacitor 30 is coupled between output terminal and the source of transistor 31 which therefore acts as common base noninverting amplifier with its drain (or output) returned to node 20. Thus the output of gain stage 13 is coupled through capacitor 30 to produce a frequency dependent voltage at the source of transistor 31. This frequency dependent voltage modulates the gate to source voltage of transistor 31 which acts as a common gate connected device. This produces a frequency compensating current feedback to node 20.

In addition to producing the frequency compensating feedback, transistor 31 isolates capacitor 30 from node 20 thereby eliminating the the loading of node 20 and the feed forward from node 20 to output terminal 25.

A dummy N-channel transistor 33 and its source current sink, N-channel transistor 34, is connected to the drain of transistor 14 to balance the operation of the differential transistors 14 and 15. The direct current flowing in transistor 31 is balanced by the direct current flowing in transistor 33 which carries no feedback signal. Using the configuration of FIG. 2 solves the instability and loading problems caused by the compensation capacitor. In terms of power supply rejection at 10K Hz the circuit of FIG. 2 is at least 20 db better than that of FIG. 1. This can be significant for audio amplifiers.

FIG. 3 is a schematic diagram of an alternative embodiment of the invention. Again, where similar parts are used the numbers of FIG. 1 are employed. The main difference is that input stage 12' is of cascode construction. Common gate N-channel load transistors 35 and 36 are coupled in series with the drains of transistors 15 and 14 respectively. The gates of transistors 35 and 36 are returned to $V_{BIAS\ 2}$ at terminal 37. This bias is selected to be intermediate between $+V_{DD}$ and ground so that these transistors will be normally biased in their saturated region of operation so that their combined conduction equals the tail current flowing in transistor 18. Frequency compensation capacitor 30 is coupled between output terminal 25 and the source of transistor 35 which, acting as a common gate amplifier, couples the capacitor back to node 20. Transistor 36 acts to balance the characteristics of input stage 12'. From a signal standpoint the circuit of FIG. 3 operates in a similar manner to that of FIG. 2 where transistor 35 acts as the voltage-controlled current source feeding back a frequency dependent current to node 20 while isolating and not loading the node. In this circuit a similar or better result is obtained.

Normally FIG. 3 will be preferred because it involves fewer parts and consumes less power and is therefore more efficient. Due to the use of the cascoded drivers higher gain is achieved in the first stage 12'. However, it has a reduced common mode range with respect to FIG. 2. Therefore, its use will be recommended for such applications as integrators and inverting amplifiers. Where a greater common mode range is required, FIG. 2 is the preferred embodiment.

It is to be understood that the circuits shown relate to conventional p-well CMOS construction where all the P-channel devices have their back gates (not illustrated) common to the semiconductor substrate which is connected to $+V_{DD}$. Each of the N-channel transistors has its own separate back gate connection as shown. Such devices can employ either metal or silicon gate construction. Other forms of construction, for example N-well construction, could also be employed. If desired all of the transistors shown could be complemented and the power supply polarity reversed.

EXAMPLE

The circuit of FIG. 3 was used as an integrator in a switched capacitor filter constructed using conventional silicon gate p-well CMOS construction. The following device sizes were employed:

| DEVICE | W/L (microns) |
|---|---|
| 14 | 104/16 |
| 15 | 104/16 |
| 16 | 120/14 |
| 17 | 120/14 |
| 18 | 54/12 |
| 21 | 470/8 |
| 22 | 240/12 |
| 35 | 104/5 |
| 36 | 104/5 |

Capacitor 30 was made 5.8 picofarads. The bias at terminal 19 was established by passing a nominal current of 30 microamperes through an N-channel transistor with its gate returned to its drain. The constructed filter exhibited 20 db better PSR than previous designs and functioned satisfactorily. Computer simulation indicates that the circuit of FIG. 3 has a 6 db per octave roll off to unity gain at about 2 MHz. The low frequency gain between the differential inputs at terminals 23–24 to output terminal 25 was about 70 db. The supply rejection ratio was 70 db at 10K Hz. The circuit displayed no instabilities.

The invention has been described and a working example detailed. When a person skilled in the art reads the foregoing description, further alternatives and equivalents, within the spirit and intent of the invention will become apparent, in addition to those described above. It is therefore intended that the scope of the invention be limited only by the following claims.

We claim:
1. A CMOS linear signal amplifier frequency compensation circuit comprising:
   an inverting amplifier having input and output terminals;
   a frequency compensation capacitor coupled between said input and output terminals; and
   a current feedback element coupled in series with said capacitor wherein said current feedback element comprises a common gate transistor amplifier having an input source coupled to said capacitor and an output drain coupled to said input of said inverting amplifier whereby said capacitor is coupled from said inverting amplifier output to said inverting amplifier input thereby providing compensation but said capacitor does not act as a capacitive load at said inverting amplifier input.

2. The circuit of claim 1 wherein said common gate transistor amplifier includes a constant current biasing device coupled in series with its source electrode.

3. The circuit of claim 2 wherein said inverting amplifier is driven from a differential input stage having a single ended output coupled to said input of said inverting amplifier.

4. The circuit of claim 3 further comprising a dummy current feedback element coupled to balance said differential input stage.

5. The circuit of claim 3 wherein said common gate transistor amplifier is incorporated into said input stage as a cascode connected driver transistor.

6. The circuit of claim 5 wherein said differential input stage further acts as said constant current device for said common gate transistor amplifier.

7. The circuit of claim 6 wherein a dummy cascode load transistor is included in said differential input stage to balance its operation.

* * * * *